United States Patent [19]

Fries

[11] Patent Number: 4,788,885
[45] Date of Patent: Dec. 6, 1988

[54] HOUSING CONSISTING OF AT LEAST TWO PARTS

[75] Inventor: Romuald Fries, Schwieberdingen, Fed. Rep. of Germany

[73] Assignee: Robert Bosch GmbH, Stuttgart, Fed. Rep. of Germany

[21] Appl. No.: 143,446

[22] Filed: Jan. 12, 1988

Related U.S. Application Data

[63] Continuation-in-part of Ser. No. 897,784, Jul. 15, 1986, abandoned.

[30] Foreign Application Priority Data

Feb. 2, 1985 [DE] Fed. Rep. of Germany ....... 3503558

[51] Int. Cl.[4] .......................... F16H 57/02; H01J 5/00; H05K 15/06
[52] U.S. Cl. ................. 74/606 R; 174/50.63; 174/52.3
[58] Field of Search ................. 74/606 R, 606 A, 608; 174/52 S, 65 R, 50.61, 50.63; 336/136; 220/359

[56] References Cited

U.S. PATENT DOCUMENTS

| | | | |
|---|---|---|---|
| 2,200,694 | 5/1940 | Gerecke et al. | 174/50.63 |
| 2,504,522 | 4/1950 | Greiner | 174/50.63 |
| 2,669,702 | 2/1954 | Klostermann | 174/50.61 |
| 2,676,197 | 4/1954 | Read et al. | 174/50.61 |
| 3,522,489 | 8/1970 | Sparrow et al. | 174/50.61 |
| 4,328,905 | 5/1982 | Hardt | 220/359 |
| 4,689,099 | 8/1987 | Ito et al. | 220/359 |

FOREIGN PATENT DOCUMENTS 8600869 2/1986 PCT Int'l Appl. ................. 220/359

*Primary Examiner*—Gary L. Smith
*Assistant Examiner*—Vinh Luong
*Attorney, Agent, or Firm*—Michael J. Striker

[57] ABSTRACT

A housing having an inner part radially inside of an outer part so as to form a hollow space therebetween. The outer part has two opposite end portions which radially extend inward toward the inner part so as to further define the hollow space. The end portions and the inner part form interengaging projections and grooves. The inner and outer parts are composed of different materials with different heat expansion coefficients. The interengaging projections and grooves are thermally expanded against each other to effect a moisture-tight sealing of the hollow space.

7 Claims, 2 Drawing Sheets

HOUSING CONSISTING OF AT LEAST TWO PARTS

CROSS-REFERENCE TO PENDING APPLICATIONS

This application is a continuation-in-part of U.S. Ser. No. 897,784, filed on July 15, 1986 now abandoned.

BACKGROUND OF THE INVENTION

The invention relates generally to housings of at least two parts which define a hollow space therebetween.

In known housings of two parts, a hollow space is formed between the two parts to accomodate electrical devices which give off heat during operation. When the two parts have different heat expansion coefficients, they thermally expand at different rates, thereby forming a slot therebetween. Dampness penetrates into the hollow space via this slot. Where electrical devices are present, operational interferences may take place.

SUMMARY OF THE INVENTION

It is an object of the present invention to provide a housing of at least two parts engaging each other so as to define a hollow space therebetween and effect a practically hermetic sealing of the hollow space with respect to the outside.

In keeping with this object, an others which will become apparent later on, one aspect of the present invention resides in a housing comprising an outer part with an inner surface and an inner part with an outer surface. The inner part is radially inside of the outer part so that a hollow space forms therebetween and the inner and outer surfaces thereby face each other. Projections and grooves are formed on the inner and outer surfaces which interengage each other. The inner and outer parts are made of different materials so as to have different heat expansion coefficients. The projections and grooves are thermally expanded into each other so as to effect a moisture-tight seal of the hollow space.

It is a further object to provide additional reinforcement by increasing the number of interengaging projections and grooves.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DETAILED DESCRIPTION OF THE PREFERRED EMBODIMENT

Figure 1:
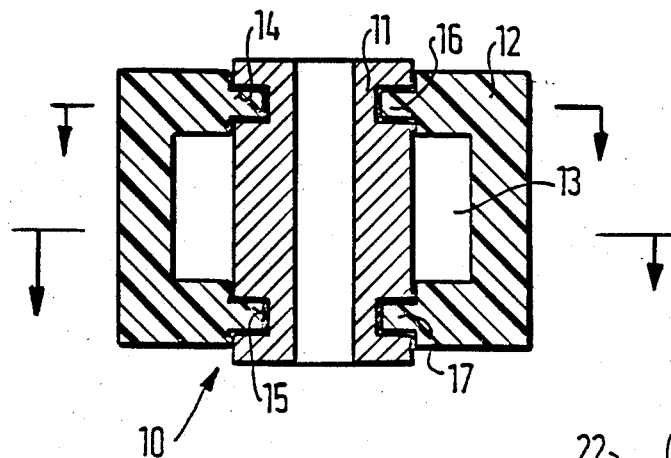
FIGS. 1-3 are elevational cross-sections of a first, a second, and a third embodiment, respectively.

Referring now to the drawings, a housing 10 comprises an inner part 11 and an outer part 12 which together form a hollow space 13 therebetween. Each part 11, 12 is hollow, cylindrical, and concentric. The hollow space 13 accomodates electrical devices, not shown, which could give off heat during their operation.

The inner part 11 is composed of a relatively hard material, such as metal, ceramic or a very hard synthetic material. The outer part 12 is composed of a substantially softer material, such as thermoplastic. Due to their difference in material, the inner and outer parts 11, 12 have different heat expansion coefficients. The thermoplastic does not combine chemically with the hard material under standard room conditions of temperature and pressure.

The cylindrical outer part 12, which may be injection molded, has two opposite ends. An extension projects from each of these ends radially inward toward the inner part 11. Each extension has a further projection 16, 17 extending further inward radially and interengaging with corresponding grooves 14, 15 formed on the outer surface of inner part 11.

The projections 16, 17 are annular, that is, continuously circular without interruption. The grooves 14, 15 are similarly annular, that is, they are continuously circular all the way around the circumference of the inner part 11.

Further, the projections 16, 17 have a rectangular-shaped cross-section in a longitudinal plane. The grooves 14, 15 are formed to conform to the shape of the projections 16, 17 so as to accomodate them therein. The grooves 14, 15 have, in cross-section in a longitudinal plane, two parallel surfaces and a third surface therebetween that is substantially perpendicular and spaced further inward radially relative to the other two parallel surfaces.

The material of the outer part 12 has a substantially greater heat expansion coefficient than the material of the inner part 11, so that the outer part 12 thermally expands in a longitudinal direction more than the inner part 11. Also, the projections 16, 17 thermally expand more severely in the axial direction than the grooves 14, 15.

The projections 16, 17 and the grooves 14, 15 are thermally expanded against each other so that a practically hermetic sealing of the hollow space 13 toward the outside is generated. Thus, moisture can not penetrate into the hollow space 13 from the outside. The thermal expansion may take place from heat given off by electrical equipment accomodated in hollow space 13.

Naturally, an effective sealing is achieved by making the outer part 12 from a harder material but with a lower heat expansion coefficient and making the inner part 11 from a softer material but with a higher heat expansion coefficient.

Figure 2:
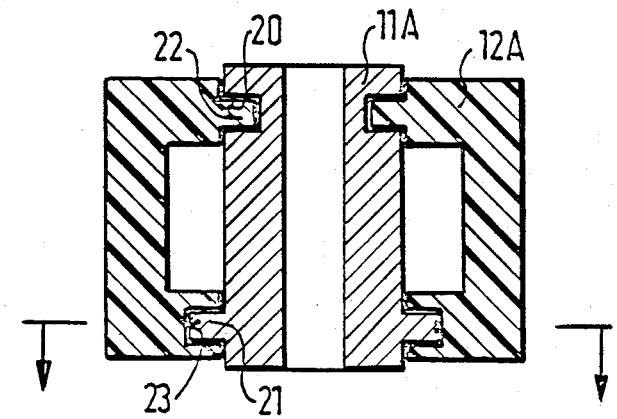

FIG. 2 shows a second embodiment in which a cylindrical outer part 12A has a annular projection 22 and an annular groove 23 which engage respectively with a groove 20 and a projection 21 of a cylindrical inner part 11A. The materials are the same as in the first embodiment and the projections 22 and grooves 23 are continuously circular. The principle behind achieving a sealing effect in this embodiment by interengaging projections and grooves is the essentially the same as for the first embodiment.

Figure 3:
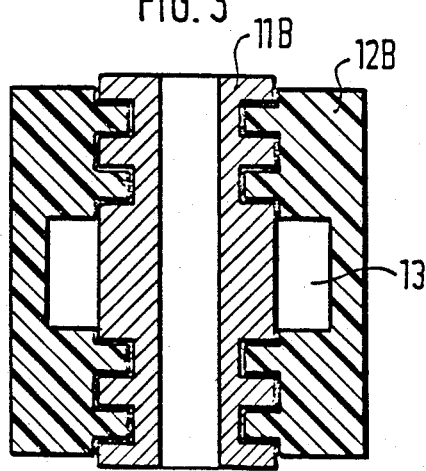
Figure 4:
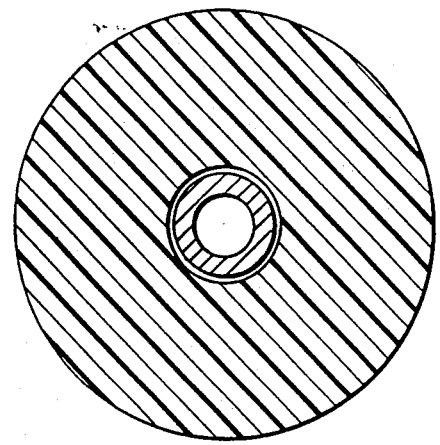
FIGS. 4-6 are cross-sectional views respectively taken across section lines IV—IV and V—V of FIG. 1 and VI—VI of FIG. 2.
Figure 5:
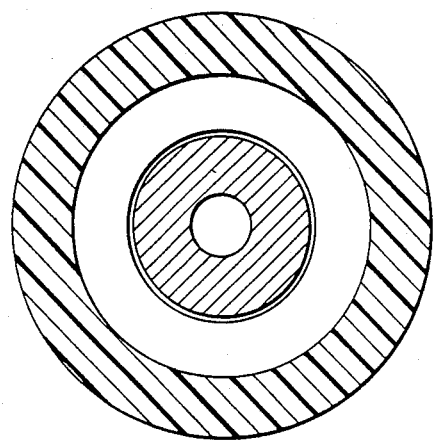
Figure 6:
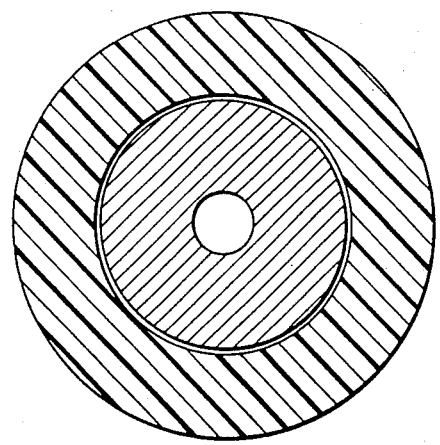

FIG. 3 shows a third embodiment which further reinforces the sealing effect. An outer cylindrical part 12B has two ends from which an annular end extension projects radially inward toward the inner part 11B, so as to further define the hollow space 13. Two annular projections extend further radially inward from each of the extensions so as to engage with two corresponding annular grooves in an inner cylindrical part 11B. Thus, there are a total of four interengaging projections and grooves, each spaced longitudinally apart from each other and each being continuously circular.

The inner and outer parts for any of the above embodiments can be made respectively from either a harder and softer material or vice versa. Similarly, the inner and outer parts for any of the above arrangements can have either the annular grooves, annular projections or any mixture thereof.

It will be understood that each of the elements described above, or two or more together, may also find a useful application in other types of housings of at least two parts differing from the types described above.

While the invention has been illustrated and described as embodied in a housing of at least two parts, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for the various applications without omitting features that, from the standpoint of prior art, fairly constitute essential characteristics of the generic or specific aspects of this invention.

What is claimed is new and desired to be protected by Letters Patent is set forth in the appended claims:

1. A housing, comprising:
an inner and an outer part, said inner part being arranged radially inside of said outer part so as to form an enclosed space radially therebetween, said parts having different heat expansion coefficients and a plurality of interengaging projections and grooves, said interengaging projections and grooves being formed to thermally expand at different rates against each other because of said different heat expansion coefficients so as to effect a moisture-tight seal of said space wherein said parts have two end portions extending radially from at least one of said parts toward the other of said parts, said end portions being formed with at least one of said projections and grooves thereon facing the other of said parts.

2. The housing as defined in claim 1, wherein said inner part and said outer part are cylindrical, said parts having circumfertial surfaces facing each other, said interengaging projections and grooves being continuously circular about entire circumference of said circumferential surfaces.

3. The housing as defined in claim 1, wherein said inner part and said outer part are formed of materials with different hardnesses.

4. The housing as defined in claim 3, wherein one of said inner part and said outer part is formed from a harder material selected from the group consisting of metal, ceramic, and a synthetic plastic and the other of said inner part and said outer part is formed from a softer material composed of a thermoplastic which does not combine chemically with said harder material under standard room conditions of temperature and pressure.

5. The housing as defined in claim 1, wherein said projections have a longitudinal cross-section having a rectangular shape, said grooves having a longitudinal cross-section defined by two parallel walls and a third wall perpendicular to and between said two parallel walls, said grooves thereby conforming in shape to said projections.

6. The housing as defined in claim 1, wherein each of said end portions is formed with a plurality of any two of said projections and grooves thereon.

7. The housing as defined in claim 1, wherein said end portions are wider in longitudinal cross-section than are said interengaging projections and grooves.

* * * * *